US006790715B1

(12) United States Patent
Luo

(10) Patent No.: US 6,790,715 B1
(45) Date of Patent: Sep. 14, 2004

(54) MANUFACTURING METHOD OF CMOS THIN FILM TRANSISTOR

(75) Inventor: Ping Luo, Hsinchu (TW)

(73) Assignee: Toppoly Optoelectronics Corp., Chu-Nan (TW)

( * ) Notice: Subject to any disclaimer, the term of this patent is extended or adjusted under 35 U.S.C. 154(b) by 0 days.

(21) Appl. No.: 10/672,193

(22) Filed: Sep. 26, 2003

(30) Foreign Application Priority Data

Feb. 25, 2003 (TW) ........................................ 92103919 A

(51) Int. Cl.$^7$ .............................................. H01L 21/00
(52) U.S. Cl. ........................ 438/149; 438/154; 438/164
(58) Field of Search ................................ 438/149, 154, 438/164, FOR 200

(56) References Cited

U.S. PATENT DOCUMENTS

| 5,047,356 | A | * | 9/1991 | Li et al. ...................... 438/154 |
| 6,372,562 | B1 | * | 4/2002 | Matsumoto ................. 438/164 |
| 6,635,521 | B2 | * | 10/2003 | Zhang et al. ................ 438/199 |

* cited by examiner

Primary Examiner—George Fourson
Assistant Examiner—Fernando L. Toledo
(74) Attorney, Agent, or Firm—Quintero Law Office

(57) ABSTRACT

A method of forming a CMOS TFT device. The present method features that the n$^+$-ion doping procedure is performed after defining the contact holes located in the doped areas. Thus, the source/drain region of the NMOS can be formed. The present invention requires only five photomasks, thereby reducing the number of photomasks consumed in the prior art.

16 Claims, 11 Drawing Sheets

MANUFACTURING METHOD OF CMOS THIN FILM TRANSISTOR

BACKGROUND OF THE INVENTION

1. Field of the Invention

The present invention relates to a thin filmtransistor (TFT) process, and more particularly, to a method of forming a complementary metal oxide semiconductor thin film transistor (CMOS TFT).

2. Description of the Related Art

In TFT-LCDs, a polycrystalline silicon (poly-Si) TFT formed on a quartz substrate or an amorphous silicon (a-Si) TFT formed on a large size glass substrate is mostly used. The TFTs in TFT-LCDs are used in one instance for a TFT matrix in a display portion and in another instance for formation of an outer circumferential circuit (also referred to as a driver circuit) on a common substrate for driving such a TFT matrix. In the former instance, an n channel TFT is used, and in the latter instance, a CMOS TFT is used for achieving high speed operation.

The CMOS TFT includes an n-type TFT (NMOS TFT) and a p-type TFT (PMOS TFT). In order to decrease the "OFF current" of the NMOS TFT, an LDD (lightly doped drain) structure is usually designed therein. Hereinafter, a conventional CMOS TFT process will be described, with reference to FIGS. 1A~1F.

In FIG. 1A, a glass substrate 100 having a predetermined NMOS area 110 and a predetermined PMOS area 120 is provided. By performing a first patterning procedure with a first photomask (or reticle), a first polysilicon layer 130 and a second polysilicon layer 135 are formed on part of the substrate 100.

The first polysilicon layer 130 is located in the NMOS area 110 and the second polysilicon layer 135 is located in the PMOS area 120.

In FIG. 1B, by performing a second patterning procedure with a second photomask, a photoresist layer 140 is formed on the first polysilicon layer 130 or the second polysilicon layer 135. As an example, the second polysilicon layer 135 is herein covered with the photoresist layer 140. Then, an ion implantation procedure 150, such as a p$^-$-ion doping procedure, is performed to adjust threshold voltage. That is, this step functions as a threshold voltage adjustment ($V_t$ adjustment). Symbol 131 indicates an adjusted first polysilicon layer.

In FIG. 1C, the photoresist layer 140 is removed. By performing a third patterning procedure with a third photomask, a photoresist layer 155 is formed on part of the first polysilicon layer 131 and over the second polysilicon layer 135. Then, an n$^+$-ion doping procedure 160 is performed to form an n$^+$-polysilicon film 170 in part of the first polysilicon layer 131. The n$^+$-polysilicon film 170 serves as the source/drain region of the NMOS area.

In FIG. 1D, the photoresist layer 155 is removed. A gate insulating layer 180 is formed on the first polysilicon layer 131, the second polysilicon layer 135 and the substrate 100. Then, a metal layer (not shown) is formed on the gate insulating layer 180. By performing a fourth patterning procedure with a fourth photomask, the metal layer (not shown) is patterned to form a first gate 190 and a second gate 195. The first gate 190 is located in the NMOS area 110 and the second gate 195 is located in the PMOS area 120.

In FIG. 1D, using the first gate 190 and second gate 195 as a mask, an n$^-$-ion doping procedure 200 is performed to form n$^-$-polysilicon film 210 in part of the first polysilicon layer 131 and part of the second polysilicon layer 135. The n$^-$-polysilicon film 210, located in the NMOS area 110, serves as the lightly doped drain (LDD) region of the NMOS TFT.

In FIG. 1E, by performing a fifth patterning procedure with a fifth photomask, a photoresist layer 220 is formed to cover the NMOS area 110. Using the photoresist layer 220 as a mask, a p$^+$-ion doping procedure 230 is then performed to form a p$^+$-polysilicon film 240 in part of the second polysilicon layer 135. The p$^+$-polysilicon film 240 serves as the source/drain region of PMOS.

Next, the photoresist layer 220 is removed. Thus, an NMOS device 250 is formed in the NMOS area 110 and a PMOS device 255 is formed in the PMOS area 120.

In FIG. 1F, a passivation layer 260 is thoroughly formed to cover the NMOS device 250 and the PMOS device 255. By performing a sixth patterning procedure with a sixth photomask, a plurality of contact holes 270 penetrating the passivation layer 260 and the gate insulating layer 180 are formed. The contact holes 270 expose the source/drain region 170 of the NMOS device 250 and the source/drain region 240 of the PMOS device 255. Finally, a conductive material is filled in the contact holes 270 to form a plurality of plugs 280.

The method for fabricating the above comprises six patterning (or photolithography and etching) steps. That is, the conventional method requires six photomasks or photomasks, which increases costs. In order to decrease manufacturing costs, a method which consumes fewer photomasks than the conventional method is called for.

SUMMARY OF THE INVENTION

The object of the present invention is to provide a method of forming a CMOS TFT, which requires fewer photomasks than the prior art.

Another object of the present invention is to provide a method of forming a CMOS TFT with five photomasks (or five photolithography steps).

In order to achieve these objects, the present invention provides a method of forming a CMOS TFT device. A substrate having a predetermined NMOS area and a predetermined PMOS area is provided, wherein the NMOS area includes a first doped area, a lightly doped area and a first gate area, and the PMOS area includes a second doped area and a second gate area. By performing a first patterning procedure with a first photomask, a first semiconductor island and a second semiconductor island are formed on part of the substrate, wherein the first semiconductor island is located in the NMOS area and the second semiconductor island is located in the PMOS area. By performing a second patterning procedure with a second photomask, the first semiconductor island and/or the second semiconductor island is exposed. Impurities are doped into the exposed first semiconductor island and/or the exposed second semiconductor island to adjust threshold voltage. An insulating layer is formed on the first semiconductor island, the second semiconductor island and the substrate. A conductive layer is formed on the insulating layer. By performing a third patterning procedure with a third photomask, part of the conductive layer is removed to define a first gate and a second gate, wherein the first gate is located in the first gate area and the second gate is located in the second gate area. Using the first gate and the second gate as a mask, an n$^-$-ion doping procedure is performed to form an LDD region in the first semiconductor island and in the lightly doped area. The PMOS area is exposed by performing a fourth patterning procedure with a fourth photomask. Using the second gate as a mask, a p$^+$-ion doping procedure is performed to form a second source/drain region in the second semiconductor island and in the second doped area. A passivation layer is formed on the insulating layer, the first gate and the second gate. By performing a fifth patterning procedure with a fifth photomask, and a first contact hole, a second contact hole, a third contact hole and a fourth contact hole penetrating the passivation layer and the insulating layer are formed, wherein the first and second contact holes correspond to the first doped area, and the third and fourth contact holes are located on the second source/drain region. By means of the first, second, third and the fourth contact holes, an n$^+$-ion doping procedure is performed to form a first source/drain region in the first semiconductor island and in the first doped area, wherein an ion dosage of the p$^+$ ions doping procedure is greater than an ion dosage of the n$^+$ ions doping procedure.

The present invention improves on the prior art in that the present method uses only five photomasks to fabricate the CMOS TFT device. Thus, the present invention can decrease photomask consumption, and thereby decreases costs.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

An embodiment according to the present invention will be explained with reference to FIGS. 2~10.

Figure 1A:
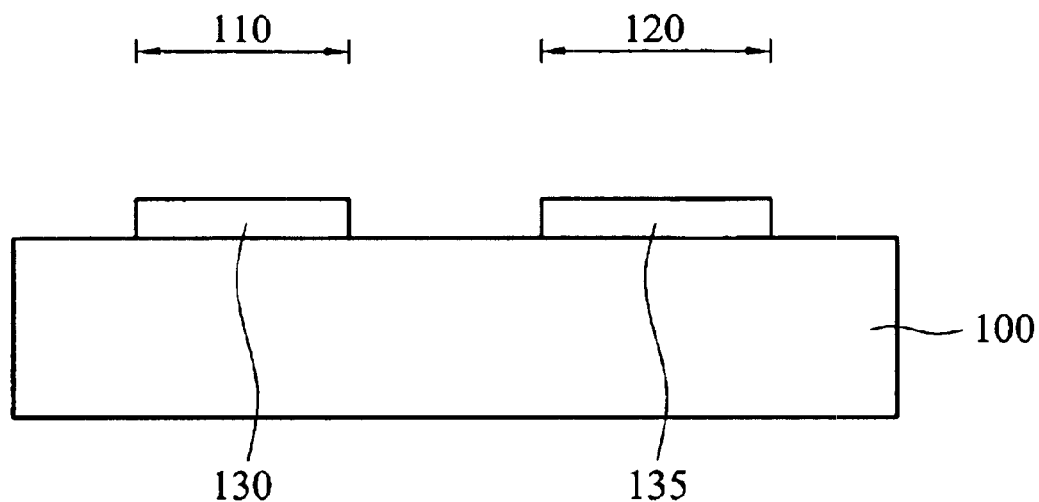
FIGS. 1A~1F are sectional views showing the conventional CMOS TFT process.
Figure 1B:
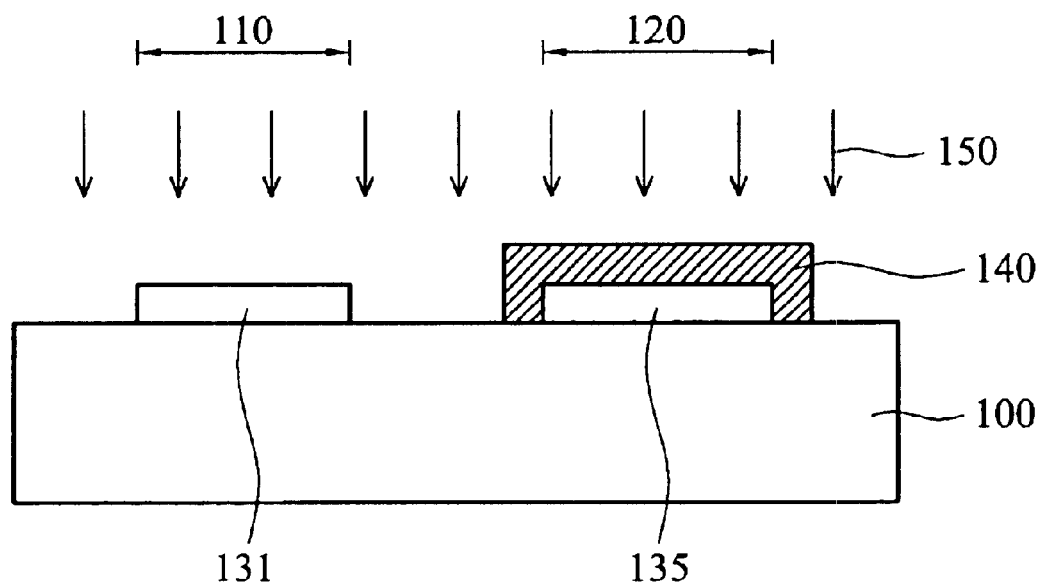
Figure 1C:
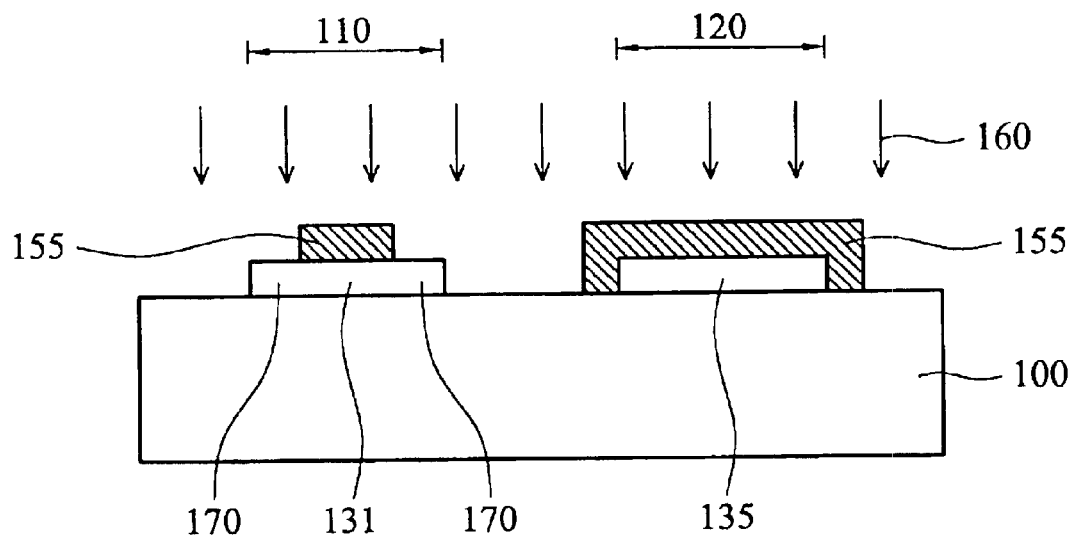
Figure 1D:
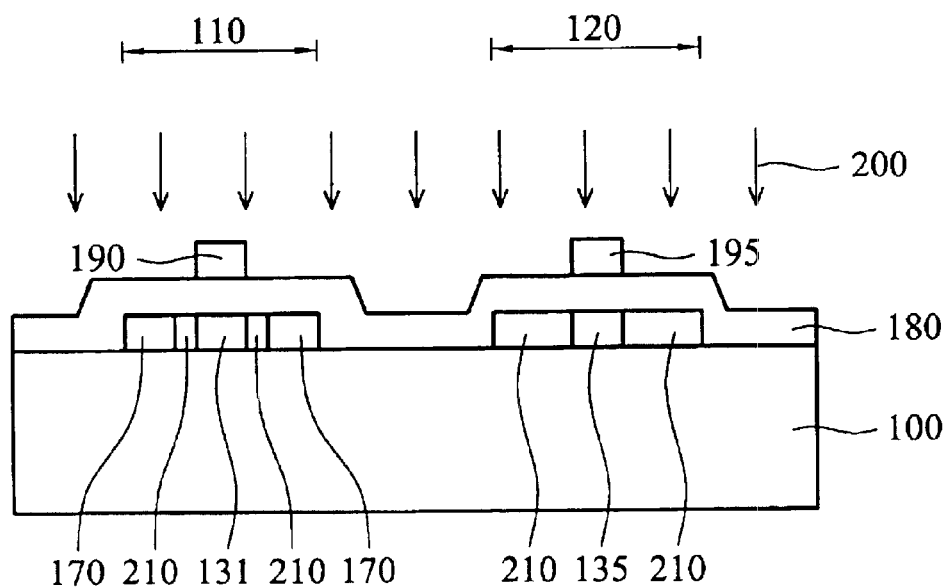
Figure 1E:
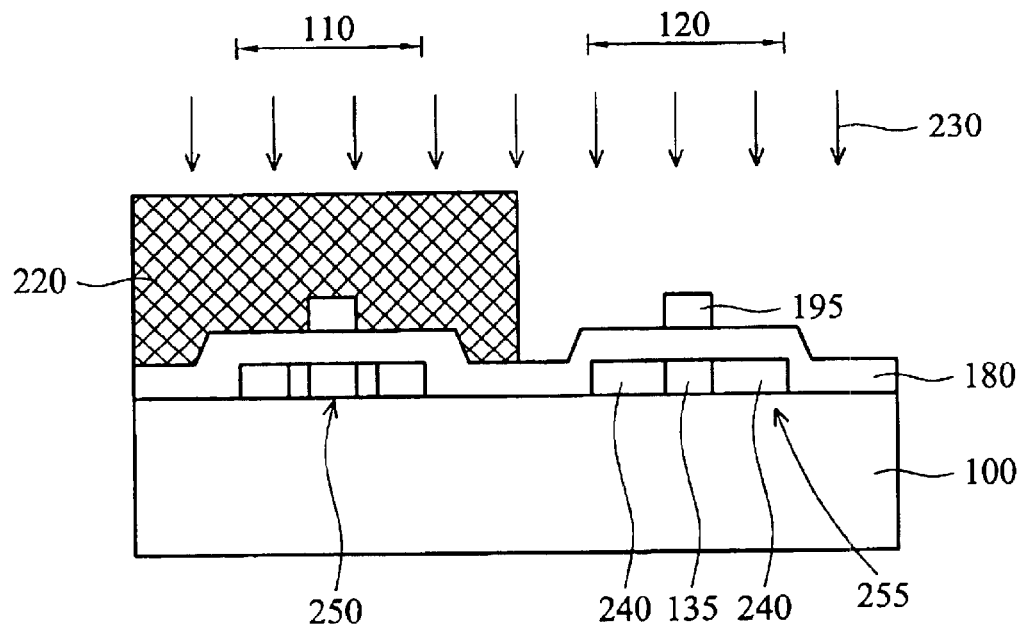
Figure 1F:
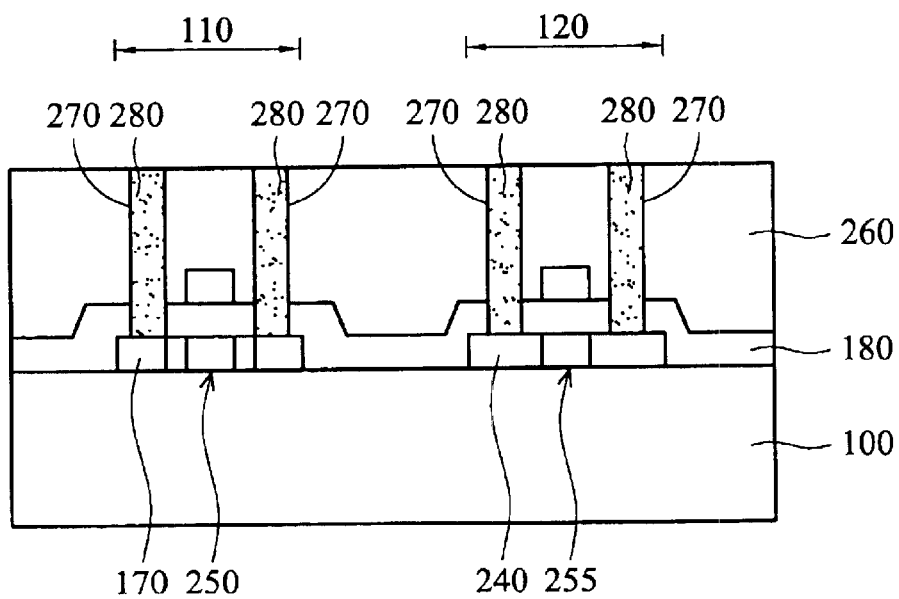
Figure 2:
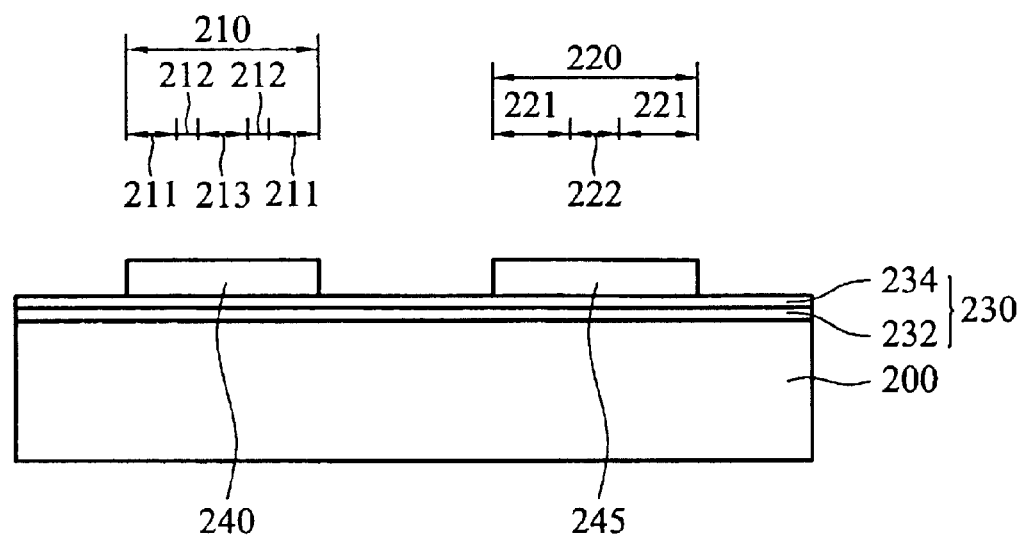
FIGS. 2~10 are sectional views showing the CMOS TFT process according to an embodiment of the present invention.

In FIG. 2, an insulating substrate 200 having a predetermined NMOS area 210 and a predetermined PMOS area 220 is provided, wherein the NMOS area 210 further includes a first doped area 211, a lightly doped area 212 and a first gate area 213, wherein the lightly doped area 212 is located between the first doped area 211 and the first gate area 213. The PMOS area 220 further includes a second doped area 221 and a second gate area 222. The insulating substrate 200 can be a heat resistant glass substrate. The NMOS area 210 is used for the NMOS device, and the PMOS area 220 is used for the PMOS device.

In FIG. 2, a buffer layer 230 (also referred to as a backing film) can be formed on the substrate 200. For example, the buffer layer 230 consists of a silicon nitride (SiN$_x$) layer 232 and a silicon oxide (SiO$_x$) layer 234. In order to simplify the illustration of this embodiment, FIGS. 3~10 do not show the buffer layer 230.

In FIG. 2, by performing a first patterning procedure with a first photomask (or reticle), and a first semiconductor island 240 and a second semiconductor island 245 are formed on part of the substrate 200, wherein the first semiconductor island 240 is located in the NMOS area 210 and the second semiconductor island 245 is located in the PMOS area 220. The semiconductor islands 240 and 245 can be amorphous silicon or polysilicon layers. In the invention, the first polysilicon layer 240 represents the first semiconductor island 240, and the second polysilicon layer 245 represents the second semiconductor island 245.

Figure 3:
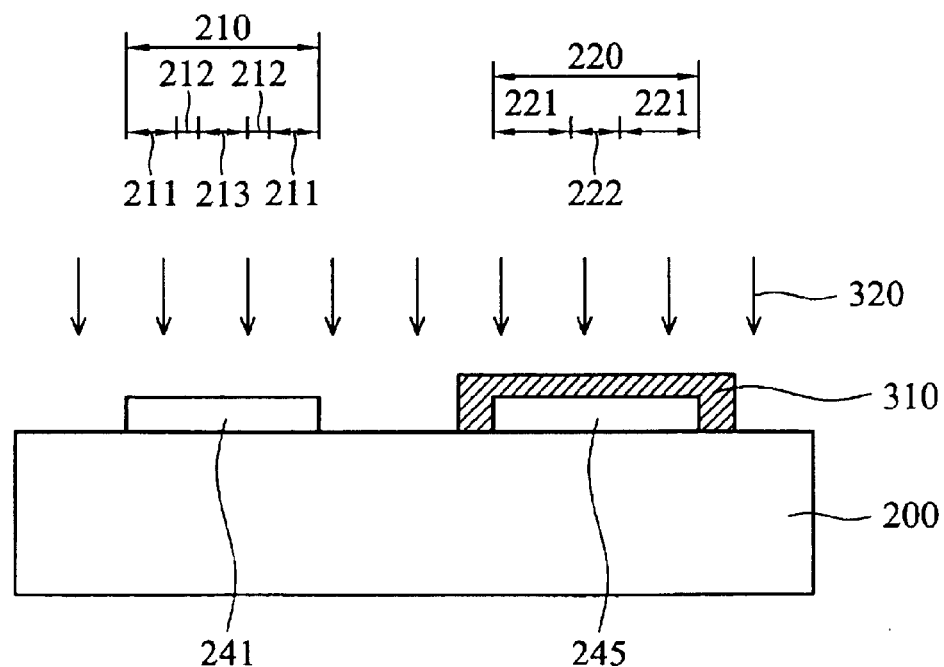

In FIG. 3, by performing a second patterning procedure with a second photomask, a first photoresist layer 310 is formed on part of the first polysilicon layer 240 and/or the second polysilicon layer 245. In this embodiment, the photoresist layer 310 covers the second polysilicon layer 245. Using the photoresist layer 310 as a mask, an ion implantation procedure 320, such as a p$^-$-ion doping procedure, is performed to adjust threshold voltage. That is, this step functions as a threshold voltage adjustment (V$_t$ adjustment). Symbol 241 indicates an adjusted first polysilicon layer.

Figure 4:
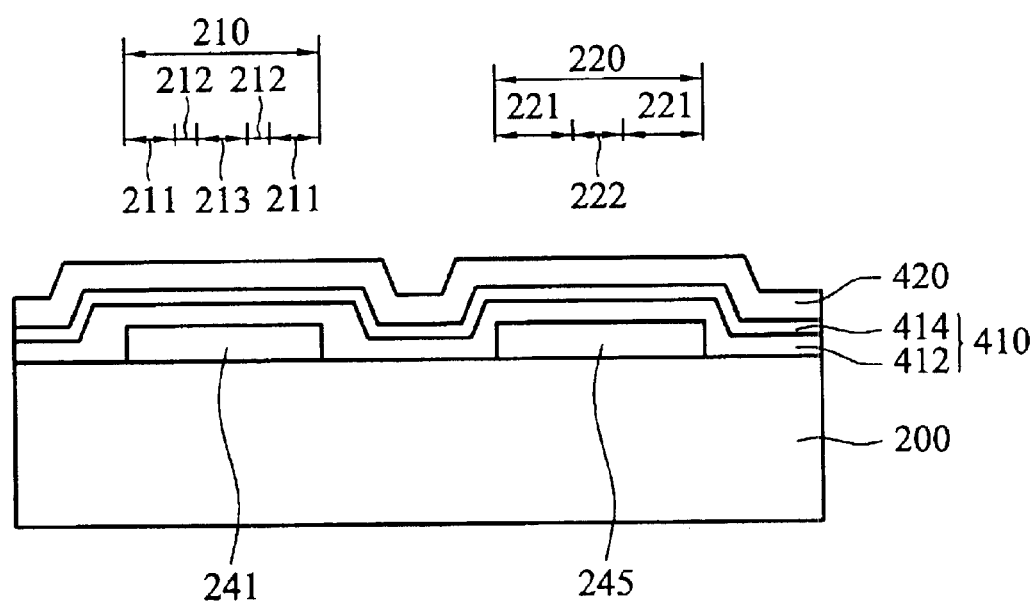

In FIG. 4, the photoresist layer 310 is removed. An insulating layer 410, serving as a gate insulating layer, is then formed on the first polysilicon layer 241, the second polysilicon layer 245 and the substrate 200. The insulating layer 410 can include a silicon oxide (SiO$_x$) layer 412 and a silicon nitride (SiN$_x$) layer 414. Then, a conductive layer 420 is formed on the insulating layer 410. The conductive layer 420 can be a Mo, Al, or Cu alloy layer.

Figure 5:
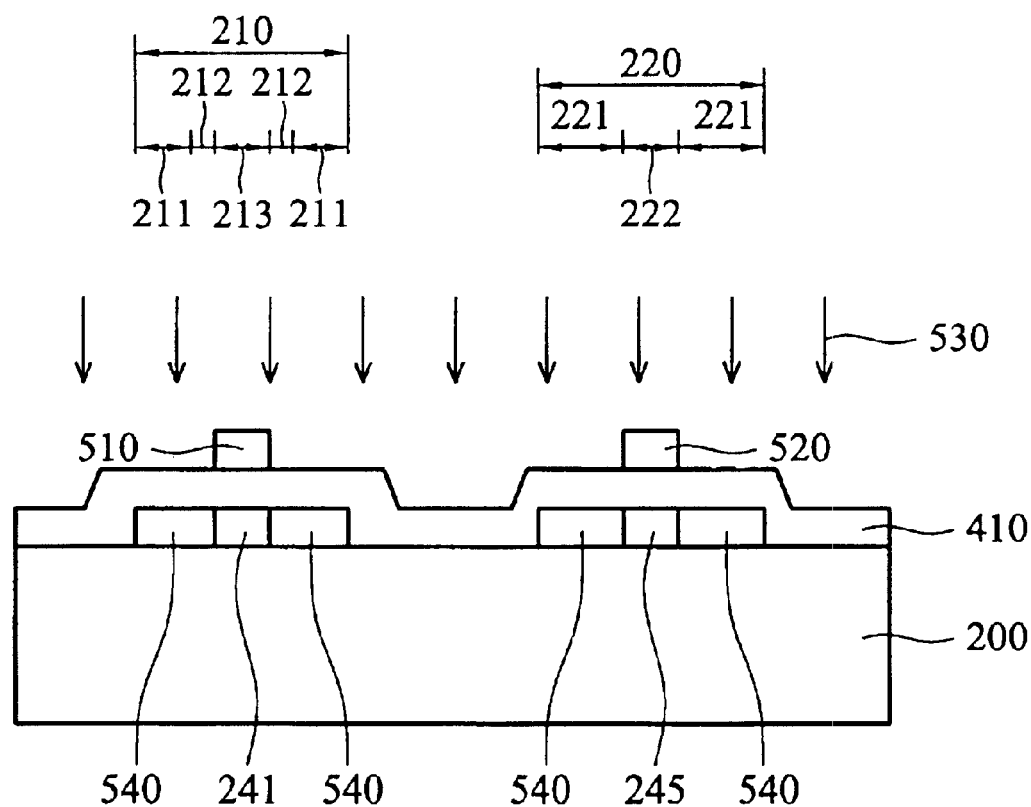

In FIG. 5, by performing a third patterning procedure with a third photomask, part of the conductive layer 420 is removed to define a first gate 510 and a second gate 520. The first gate 510 is located in the first gate area 213 and the second gate 520 is located in the second gate area 222.

In FIG. 5, using the first gate 510 and the second gate 520 as a mask, an n$^-$-ion doping procedure 530 is performed to form an n$^-$-polysilicon layer 540 in part of the first polysilicon layer 241 and part of the second polysilicon layer 245. The n$^-$-polysilicon layer 540 serves as an LDD (lightly doped drain) region in the first polysilicon layer 241. Also, the n$^-$-polysilicon layer 540 corresponds to the lightly doped area 212. The ion dosage of the n$^-$-ion doping procedure 530 can be 1E11~1E14 atom/cm$^2$.

Figure 6:
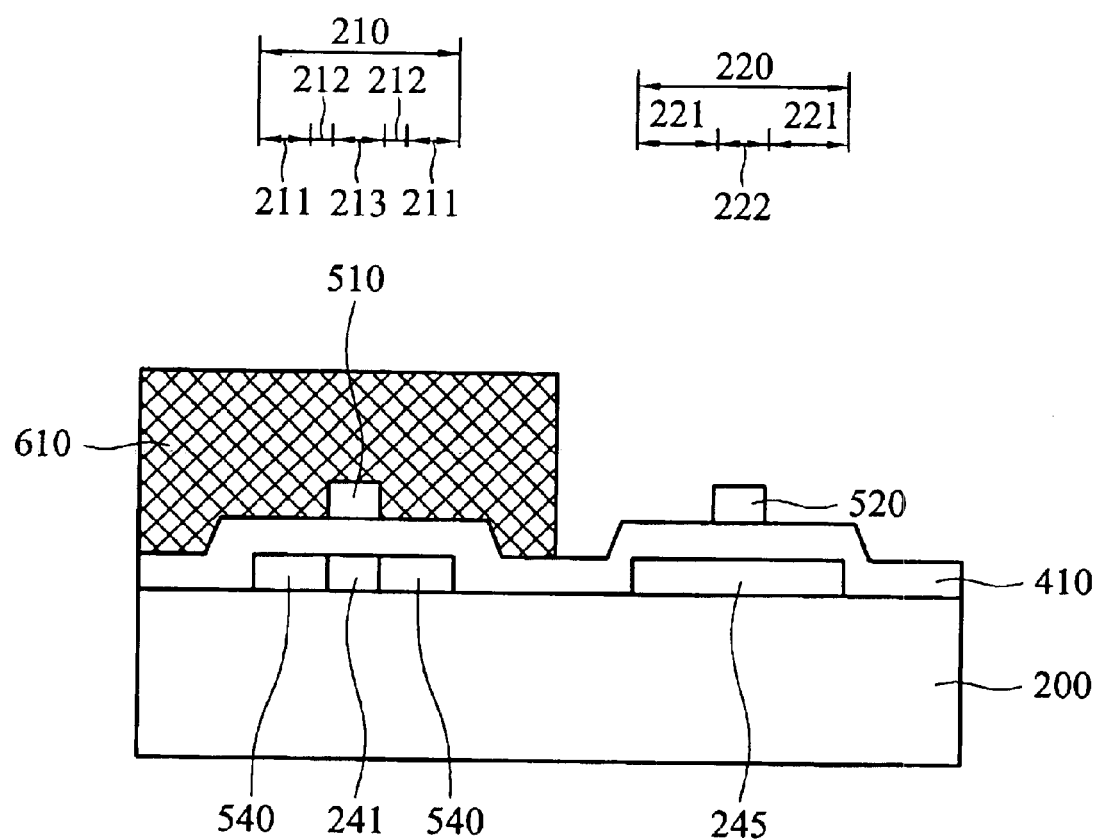

In FIG. 6, by performing a fourth patterning procedure with a fourth photomask, a second photoresist layer 610 is formed to cover the NMOS area 210.

Figure 7:
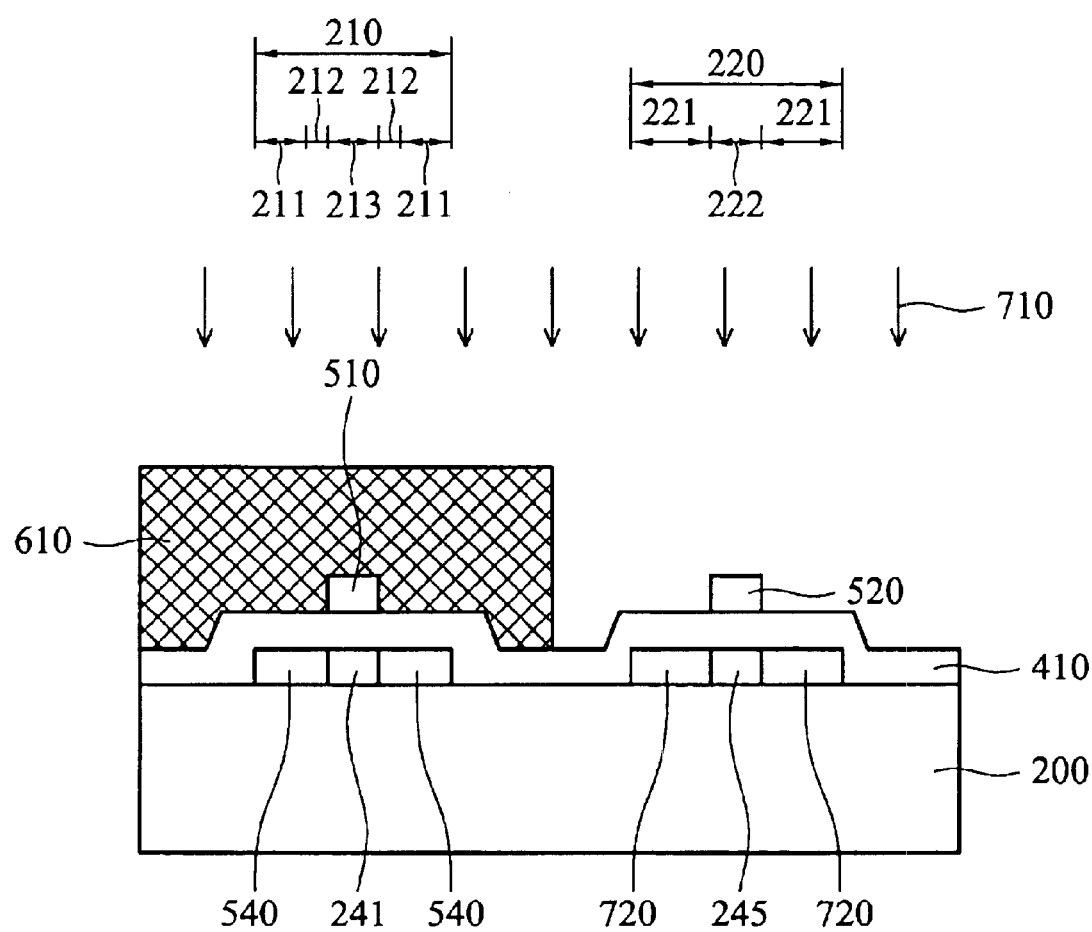

In FIG. 7, using the second gate 520 and the photoresist layer 610 as a mask, a p$^+$-ion doping procedure 710 is performed to form a p$^+$-polysilicon layer 720 in part of the second polysilicon layer 245. The p$^+$-polysilicon layer 720 serves as a source/drain region 720 of PMOS and corresponds to the second doped area 221. The ion dosage of the p$^+$-ion doping procedure 710 can be 1E16~1E20 atom/cm$^2$.

Figure 8:
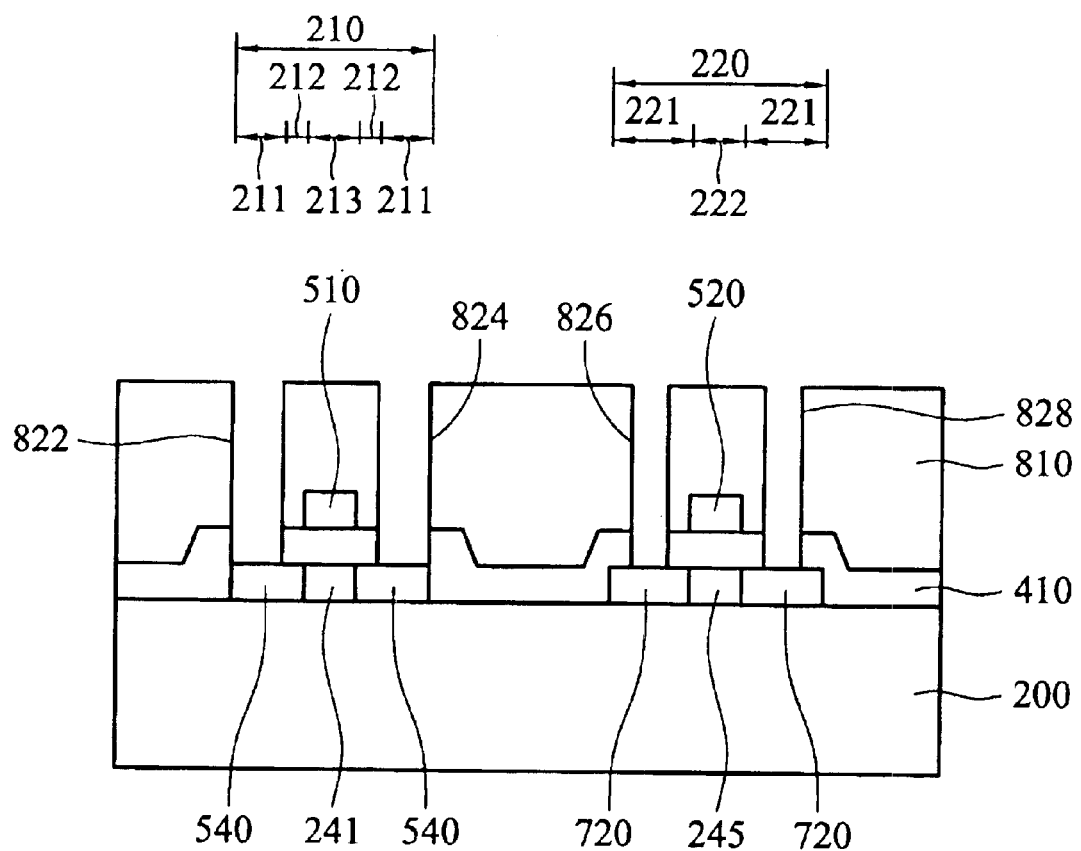

In FIG. 8, the photoresist layer 610 is then removed. A passivation layer 810 is formed on the insulating layer 410, the first gate 510 and the second gate 520. The passivation layer 810 can be a silicon oxide (SiO$_x$) layer or a silicon nitride (SiN$_x$) layer.

In FIG. 8, by performing a fifth patterning procedure with a fifth photomask, a first contact hole 822, a second contact hole 824, a third contact hole 826 and a fourth contact hole 828 penetrating the passivation layer 810 and the insulating layer 410 are formed. The first and second contact holes 822, 824 correspond to the first doped area 211, and the third and fourth contact holes 826, 828 are located on (above) part of the second source/drain region 720. Care must be exercised so that the third and fourth contact holes 826, 828 do not touch the second gate 520. That is, the third and fourth contact holes 826, 828 are insulated from the second gate 520.

Figure 9:
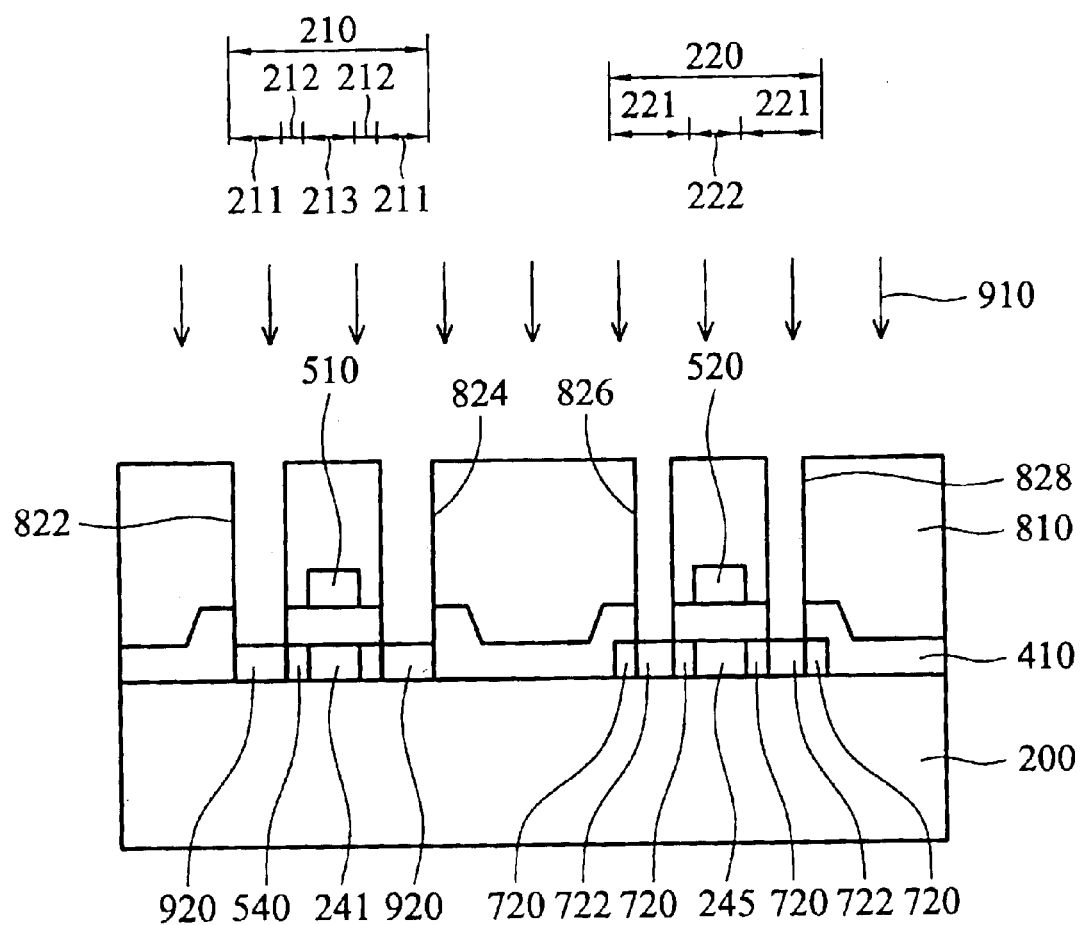

In FIG. 9, by means of the first, second, third and the fourth contact holes 822, 824, 826 and 828, an n$^+$-ion doping procedure 910 is performed to form an n$^+$-polysilicon layer 920 in part of the first polysilicon layer 241. The n$^+$-polysilicon layer 920 serves as a source/drain region 920 of the NMOS area and corresponds to the first doped area 211. The ion dosage of the n⁺-ion doping procedure 910 can be 1E15~1E19 atom/cm².

It should be noted that the ion dosage of the p⁺-ion doping procedure 710 is at least ten times greater than that of the n⁺-ion doping procedure 910. Referring to FIG. 9, although a lighter p⁺-doped region 722 (may referred to as a PLDD region, p-type lightly doped drain region) exists in the p⁺-polysilicon layer 720, the lighter p⁺-region 722 do not seriously affect the electrical property of the PMOS. In order to describe the present invention, the source/drain region 720 of PMOS represents the p⁺-polysilicon layer 720 including the lighter p⁺-doped region 722.

Figure 10:
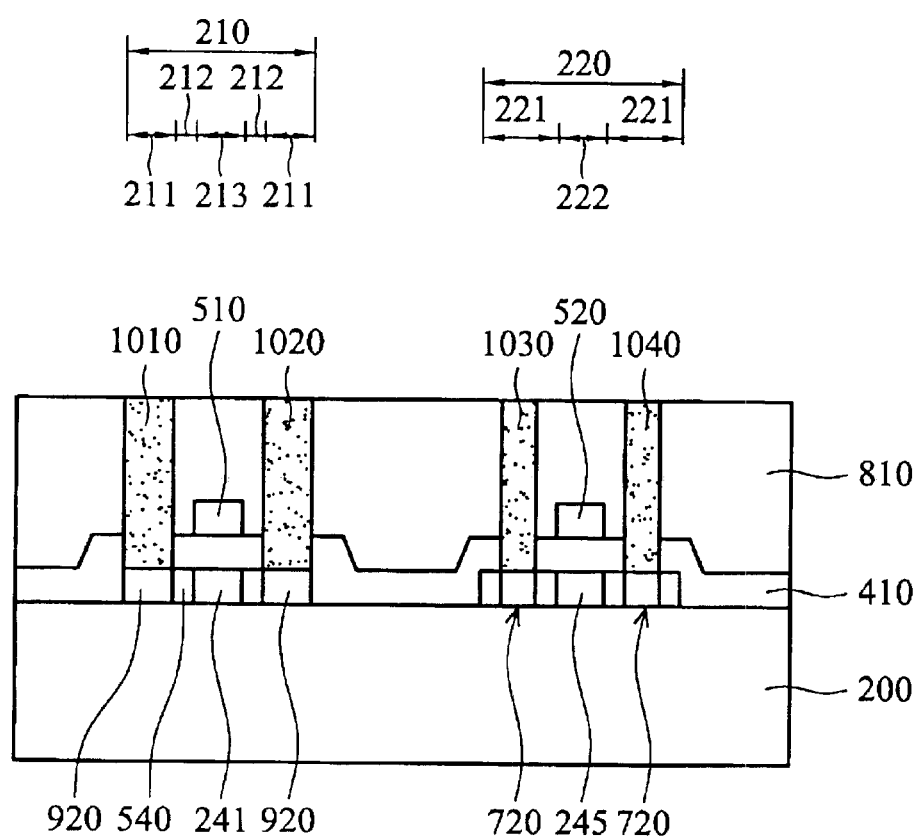

In FIG. 10, a conductive material, such as metal, is filled in the first, second, third and the fourth contact holes 822, 824, 826 and 828 to form a first plug 1010, a second plug 1020, a third plug 1030 and a fourth plug 1040. The first and second plugs 1010, 1020 electrically connect the source/drain region 920 of the NMOS device. The third and fourth plugs 1030, 1040 electrically connect the source/drain region 720 of the PMOS device. Thus, the CMOS TFT process only utilizes five photo masks.

The present invention improves on the prior art in that the present method performs the n⁺-ion doping procedure (910) after defining the contact holes (822, 824, 826, and 828) located in the doped areas (211, 221). Thus, the NMOS source/drain region (920) can be obtained. The present method uses only five photomasks to fabricate a CMOS TFT device, thereby decreasing photomask consumption and manufacturing cost.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming a TFT device, comprising the steps of:

providing a substrate;

performing a first patterning procedure with a first photomask to form a first semiconductor island and a second semiconductor island on part of the substrate;

performing a second patterning procedure with a second photomask to expose the first semiconductor island and/or the second semiconductor island;

doping impurities into the exposed first semiconductor island and/or the exposed second semiconductor island to adjust threshold voltage;

forming an insulating layer on the first semiconductor island, the second semiconductor island and the substrate;

forming a conductive layer on the insulating layer;

performing a third patterning procedure with a third photomask to remove part of the conductive layer and define a first gate and a second gate;

using the first gate and the second gate as a mask, performing an n⁻-ion doping procedure to form an LDD region in the first semiconductor island;

performing a fourth patterning procedure with a fourth photomask to expose the second gate;

using the second gate as a mask, performing a p⁺-ion doping procedure to form a second source/drain region in the second semiconductor island;

forming a passivation layer on the insulating layer, the first gate, and the second gate;

performing a fifth patterning procedure with a fifth photomask to form a plurality of contact holes penetrating the passivation layer and the insulating layer to expose portions of the first and second semiconductor islands; and by means of the contact holes, performing an n⁺-ion doping procedure to form a first source/drain region in the first semiconductor island;

wherein an ion dosage of the p⁺-ion doping procedure is greater than an ion dosage of the n⁺-ion doping procedure.

2. The method according to claim 1, further comprising the step of:

filling a conductive material in the contact holes to form a plurality of plugs;

wherein the plugs electrically connect the first source/drain region or the second source/drain region.

3. The method according to claim 1, further comprising, before forming the first and second semiconductor islands, the step of:

forming a buffer layer on the substrate.

4. The method according to claim 3, wherein the buffer layer includes a silicon nitride layer and a silicon oxide layer.

5. The method according to claim 1, wherein the first and second semiconductor islands include silicon.

6. The method according to claim 1, wherein the insulating layer includes a silicon nitride layer and a silicon oxide layer.

7. The method according to claim 1, wherein the conductive layer is a metal layer.

8. The method according to claim 1, wherein the ion dosage of the p⁺-ion doping procedure is ten times greater than that of the n⁺-ion doping procedure.

9. The method according to claim 1, wherein the passivation layer is a silicon nitride layer or a silicon oxide layer.

10. A method of forming a CMOS TFT device with five photomasks, comprising steps of:

providing a substrate;

performing a first patterning procedure with a first photomask to form a first semiconductor island and a second semiconductor island on part of the substrate;

performing a second patterning procedure with a second photomask to expose part of the first semiconductor island and/or the second semiconductor island;

doping impurities into the exposed first semiconductor island and/or the exposed second semiconductor island to adjust threshold voltage;

forming a gate insulating layer on the first semiconductor island, the second semiconductor island and the substrate;

forming a conductive layer on the gate insulating layer;

performing a third patterning procedure with a third photomask to remove part of the conductive layer and define a first gate and a second gate, wherein the first gate is located above the first semiconductor island and the second gate is located above the second semiconductor island;

using the first gate and the second gate as a mask, performing an n⁻-ion doping procedure to form an LDD region in the first semiconductor island;

performing a fourth patterning procedure with a fourth photomask to expose the second gate;

using the second gate as a mask, performing a p$^+$-ion doping procedure to form a second source/drain region in the second semiconductor island;

forming a passivation layer on the insulating layer, the first gate, and the second gate;

performing a fifth patterning procedure with a fifth photomask, and forming a plurality of contact holes penetrating the passivation layer and the insulating layer, wherein the contact holes are located above the first semiconductor island and the second semiconductor island; and by means of the contact holes, performing an n$^+$-ion doping procedure to form a first source/drain region in the first semiconductor island;

wherein an ion dosage of the p$^+$-ion doping procedure is ten times than that of the n$^+$-ion doping procedure.

11. The method according to claim 10, further comprising the step of:

filling a conductive material in the contact holes to form a first plug, a second plug, a third plug and a fourth plug;

wherein the first and second plugs electrically connect the first source/drain region and the third and fourth plugs electrically connect the second source/drain region.

12. The method according to claim 10, further comprising, before forming the first and second semiconductor islands, the step of:

forming a buffer layer on the substrate.

13. The method according to claim 12, wherein the buffer layer includes a silicon nitride layer and a silicon oxide layer.

14. The method according to claim 10, wherein the insulating layer includes a silicon nitride layer and a silicon oxide layer.

15. The method according to claim 10, wherein the conductive layer is a metal layer.

16. The method according to claim 10, wherein the passivation layer is a silicon nitride layer or a silicon oxide layer.

* * * * *